United States Patent
Wang

Patent Number: 6,060,208
Date of Patent: May 9, 2000

[54] METHOD FOR MATCHING OPTICAL DENSITY IN COLOR PROOFING

[75] Inventor: Tangyu Wang, Coquitlam, Canada

[73] Assignee: Creo Products Inc., Burnaby, Canada

[21] Appl. No.: 09/293,803

[22] Filed: Apr. 19, 1999

Related U.S. Application Data

[63] Continuation-in-part of application No. 09/003,356, Jan. 6, 1998, abandoned, which is a continuation-in-part of application No. 08/767,073, Dec. 16, 1996, abandoned.

[51] Int. Cl.$^7$ .................................. G03C 5/22; G03F 3/10
[52] U.S. Cl. ..................... 430/201; 430/200; 430/945; 346/764; 503/227
[58] Field of Search .................................. 430/200, 201, 430/945; 346/76 L; 503/227

[56] References Cited

U.S. PATENT DOCUMENTS

| | | | |
|---|---|---|---|
| 3,745,586 | 7/1973 | Braudy | 430/201 |
| 4,698,691 | 10/1987 | Suzuki et al. | |
| 4,804,975 | 2/1989 | Yip | 346/76 L |
| 5,164,742 | 11/1992 | Baek et al. | 346/76 L |
| 5,747,217 | 5/1998 | Zaklika et al. | 430/201 |

*Primary Examiner*—Richard L. Schilling
*Attorney, Agent, or Firm*—Oyen Wiggs Green & Mutala

[57] ABSTRACT

A method for controlling the color density of colorant transferred to a substrate involves creating tiny gap areas in the coverage of the colorant. The method is useful in producing color proofs of halftone images. The gap areas are typically much smaller than a screen dot in a halftone image. The method permits the generation of a proof which has the same sizes of screen dots as will appear in the final printed image while operating in the saturation portion of the transfer function for the colorant being used. Suitable gap areas may be provided by pulsing a laser used to transfer colorant from a donor to a substrate. The method does not require the use of a variable power laser and therefore is more stable than previous proofing methods.

11 Claims, 2 Drawing Sheets

FIG. 1B ENERGY
PRIOR ART

METHOD FOR MATCHING OPTICAL DENSITY IN COLOR PROOFING

CROSS REFERENCE TO RELATED APPLICATIONS

This application is a continuation-in-part of application Ser. No. 09/003,356 filed Jan. 6, 1998, now abandoned and entitled DENSITY CALIBRATION METHOD FOR COLOR PRINTING which is, in turn a continuation-in-part of application Ser. No. 08/767,073 filed Dec. 16, 1996, now abandoned, and entitled DENSITY CALIBRATION METHOD FOR COLOR PRINTING, now abandoned.

FIELD OF THE INVENTION

This invention relates to hard copy devices. The invention has particular application in devices for color proofing halftone prints.

BACKGROUND OF THE INVENTION

In the printing industry it is necessary to be able to obtain a proof. A proof is an accurate representation of the appearance of a final printed image. The proof can be used to check that the results of the print run will be exactly as desired before the print run is set up. As setting up a print run can be very expensive, the availability of accurate proofs can save much time and expense. The need for very accurate proofs is particularly strong in the area of color printing.

The image produced by a printing press generally consists of halftone areas which have a very large number of small dots of ink, printed onto paper. The dots in the halftone areas are called "screen dots". Screen dots typically have sizes in the range of 0.1 to 0.2 mm. In addition to halftone areas made up of screen dots, the printed image may also have solid color areas.

The appearance of a halftone printed image is determined by the size and positions of the screen dots, the intrinsic characteristics of the ink used and the thickness of the ink layer deposited in the printing process. It is this appearance that a proof attempts to predict. In producing a proof, the goal is to match the apparent color of each area in a proof as closely as possible to the apparent color of the corresponding area of a final printed image.

Devices called "halftone color proofers" or "dot proofers" are currently used in the printing industry to provide color composite images which predict the end result of a printing process. Most available halftone color proofers operate by transferring a colorant from a sheet coated with a uniform layer of colorant (which may be called a "donor") to a substrate such as paper, plasticised paper, or another suitable substrate. In this specification the term "colorant" includes pigments, dyes and other coloring agents which can be transferred to a substrate to produce a proof. Modern halftone color proofers typically use a laser to transfer the colorant from the donor to the substrate. This is done by placing the donor sheet close to a substrate and focussing laser energy on a small area of the donor sheet. The energy causes colorant in the small area to be ejected from the donor sheet and to be deposited onto adjacent parts of the substrate. The laser power is turned on and off as the laser is scanned across the donor sheet. The colorant forms a patterned layer on the substrate.

The apparent color of a portion of a proof is determined by the area coverage of screen dots in that portion, the characteristics of the transferred colorant and the amount of colorant transferred (e.g. the thickness of the layer of transferred colorant). In general the optical density of the colorant used in a halftone color proofer will be different from the optical density of the ink used to print the final printed image.

It is desirable to operate a halftone color proofer in "saturation mode" or "binary mode" wherein, in each pixel on the proof, either a maximum amount of the available colorant is transferred from the donor onto the substrate or no colorant is transferred. An advantage of operating in binary mode is that it is not necessary to maintain precise control over laser output. Small fluctuations in laser output power will have little effect as long as the laser retains the ability to transfer a maximum amount of colorant to a pixel on the proof.

In prior art binary mode color proofers, the apparent color of an area on a proof is adjusted by changing the sizes of the screen dots in that area. A significant disadvantage of operating in binary mode is that changing the sizes of the screen dots to sizes which are different from that of the final printed image can subtly, but significantly, alter the appearance of the proof. Prior art halftone color proofers have particular difficulty in matching apparent colors in solid color areas, where there are no screen dots.

Another type of laser halftone proofer varies the thickness of the layer of colorant which is transferred to the substrate in an attempt to match the optical density of the colorant to the optical density of the ink to be used in the printing press. Such systems typically use variable power lasers to vary the amount of colorant transferred to each portion of the substrate. Such systems allow accurate matching of ink optical density but are prone to calibration errors. Since the thickness (and consequently the optical density) of the transferred colorant varies with laser power output, any fluctuation in the laser power output will result in undesired fluctuations in the optical density of the deposited colorant. Another disadvantage of proofers which use a variable power laser is that laser beams typically have a Gaussian power distribution profile. Increasing laser power tends to increase the area of a donor sheet affected by the laser beam which, in turn, tends to increase the size of printed features.

SUMMARY OF THE INVENTION

This invention provides a method for matching the apparent optical density of an area within a proof to a desired value. The method creates a proof by depositing a colorant on a substrate in the area in question. The deposited colorant has an optical density greater than the desired value. Tiny gap areas are left in the deposited colorant. The effect of the gap areas is to reduce the apparent optical density of the deposited colorant to the desired value.

Accordingly, One aspect of the invention provides a method for producing a proof simulating a halftone printed image. The method begins with providing a halftone image comprising a plurality of screen dots to be printed with an ink of a first optical density. The method then transfers a colorant to a substrate within screen dot regions corresponding to the screen dots. The transferred colorant has a second optical density greater than the first optical density. While transferring the colorant, the method leaves gap areas within the screen dot regions. The gap areas are substantially free of pigment. The apparent optical density of the screen dot regions is substantially the same as the first optical density. The gap areas are too small to be noticeable to the unaided human eye.

The pigment may be transferred by a laser operating in the "saturation" region of a transfer function of the pigment being transferred so that the optical density of the layer of transferred pigment does not vary significantly with fluctuations in laser power output.

Another aspect of the invention provides a method for achieving a desired apparent optical density in a solid region of a proof. The method comprises depositing a colorant on a region of a substrate corresponding to the solid region to yield a layer of deposited colorant. The deposited colorant has an optical density greater than the desired apparent optical density. The method leaves gap areas in the layer of deposited colorant. The gap areas containing substantially no colorant. Each gap area has a dimension less than 0.03 mm. An overall apparent optical density of the region of the substrate is substantially equal to the desired apparent optical density.

BRIEF DESCRIPTION OF THE DRAWINGS

In drawings which illustrate non-limiting embodiments of the invention:

FIG. 1B is a graph of the transfer function of a colorant in a typical laser pigment transfer system;

DETAILED DESCRIPTION

Prior Art

Figure 1A:
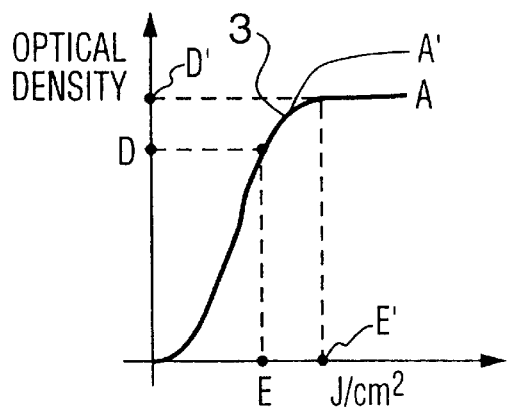
FIG. 1A is a highly magnified view of halftone screen dots printed on a substrate using the transfer point "D" of FIG. 1B.
Figure 1A:
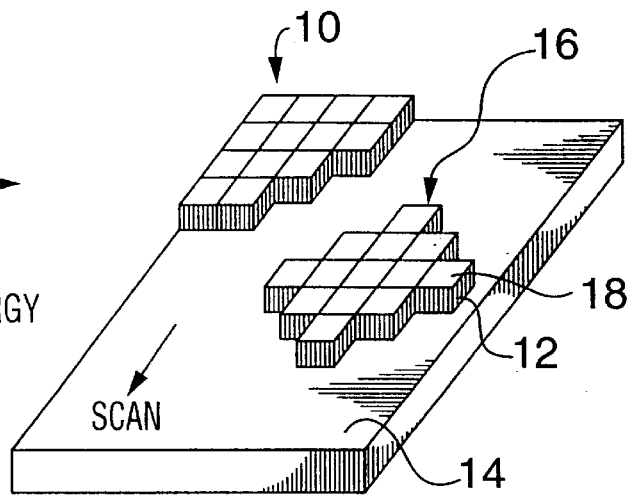

FIG. 1A shows a highly magnified view of a small portion of a proof 10 of a halftone image produced by a prior art halftone color proofer (not shown) which uses a laser (not shown) to transfer pigment 12 onto a substrate 14. The portion of proof 10 shown in FIG. 1A includes a region 16 which corresponds to a small screen dot in the image. The optical density of colorant 12 in screen dot region 16 depends upon the thickness of the layer of colorant 12 deposited in screen dot region 16. The thickness of deposited colorant 12 depends upon the energy density of the laser in the halftone color proofer. In proof 10 the shapes of screen dot regions 16 and other features are approximated by pixels 18. Each pixel 18 is either substantially devoid of colorant or is filled with a substantially uniform layer of colorant 12. Colorant 12 does not need to be colored. For example, colorant 12 may be black in some cases.

As described above, a typical donor material used for proofing has a thin uniform layer of colorant. By applying energy to a small area of the colorant layer, for example, with a focussed laser, the colorant within the small area can be caused to transfer to an adjacent substrate, such as a sheet of paper. As the energy applied to the small area is increased, the amount of colorant transferred to the substrate is also increased. Eventually, however, the energy is sufficient to transfer substantially all of the colorant within the small area of the colorant layer to the substrate. After this point, increasing the energy cannot cause any more colorant to be transferred to the substrate.

FIG. 1B shows transfer functions A and A' for a typical proofing material. Transfer function A relates the optical density of colorant 12 deposited on substrate 14 to the energy density of the laser used to cause the transfer of colorant 12. The laser output energy is selected to be at point E, so that the transferred colorant layer will have a thickness which provides an optical density D which matches the optical density of the ink which will be used in the printing process. It can be appreciated that if the laser power output varies from point E then the optical density D of the transferred and deposited colorant will also vary.

A laser energy E' is used for operation in binary (or "saturation") mode. It can be seen that small variations in energy about E' result in negligible variations in the optical density of the colorant layer deposited on a substrate because curve A is essentially horizontal in its portions near E'. In binary mode it is only possible to produce an optical density D'. Optical density D' is the optical density produced when substantially the entire thickness of the colorant within an area on the donor sheet is transferred to adjacent portions of a substrate. A disadvantage of operating in binary mode is there is no convenient way to compensate for batch to batch variations in the colorant material. Such batch to batch variations can alter the transfer function as illustrated by the difference between curves A and A' of FIG. 1B. Transfer function A' corresponds to a proofing material having a slightly thicker layer of colorant than transfer function A.

This Invention

This invention takes advantage of the fact that the resolution of a modern dot proofer is much finer than the size of a typical screen dot. Preferred embodiments of the invention take advantage of the fact that the resolution achievable in a dot proofer is typically finer than the sizes of the pixels used to approximate screen dots and other features in a dot proofer. While a typical screen dot has a size in the range of approximately 0.1 to 0.2 mm, a dot proofer typically prints pixels having sizes in the range of about 0.01 to about 0.02 mm in size. Dot proofer technology is capable of resolving features having a size of significantly less than about 0.02 mm.

The invention involves varying the apparent density of colorant in a proof by leaving tiny gaps or "gap areas" in colorant bearing portions of the proof. The gap areas are much smaller than a screen dot. As a screen dot is barely visible to the unaided eye, gap areas much smaller than a screen dot are not visible. The gap areas preferably have at least one dimension smaller than 0.03 mm. At a distance of 10 cm the human eye is even theoretically incapable of resolving features smaller than about 0.03 mm in size. Despite the fact that the gap areas are so small, they do change the perceived color density of the deposited colorant. The high resolution of a dot proofer permits the size and number of gap areas to be accurately controlled.

Figure 2:
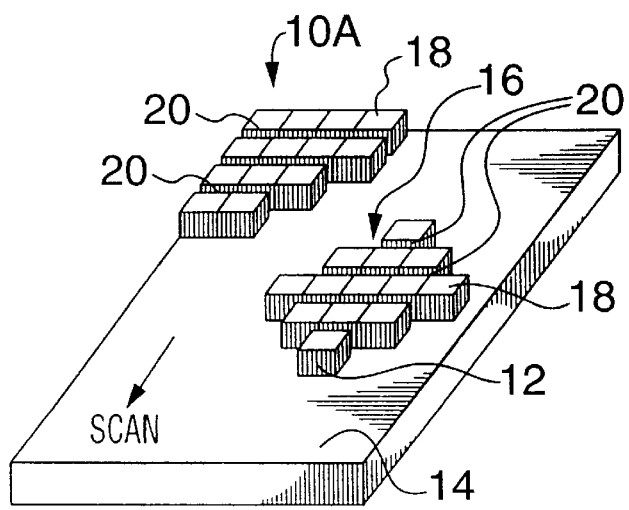
FIG. 2 is a highly magnified view of halftone screen dots printed on a substrate using the transfer point "D1" of FIG. 1a with the density controlled by leaving small gaps between rows of pixels; and, FIG. 3 is a highly magnified view of a solid color region of a proof wherein the density of the color is controlled by leaving small gaps.

FIG. 2 shows a proof 10A printed according to a first embodiment of the invention. Proof 10A comprises a substrate 14, which is typically a sheet of paper. Substrate 14 is preferably white. Certain areas of substrate 14 are covered with colorant 12. The areas covered with colorant 12 have an optical density higher than that of deposited ink in corresponding areas of the final printed image which the proof seeks to emulate. The optical density of the ink which the proof seeks to emulate may be called a "first optical density" while the optical density of the deposited colorant may be called a "second optical density" with the second optical density greater than the first optical density. This is preferably achieved by providing enough energy to a suitable donor to operate in the saturation region (e.g. at point E' of FIG. 1a). In proof 10A the apparent optical density of screen dot regions 16, which correspond to screen dots, and regions corresponding to other features is reduced by leaving gap areas 20 within the regions 16. In the gap areas substantially no colorant is transferred to substrate 14. Gap areas 20 may be created, for example, by turning off the laser beam being used to transfer colorant to substrate 14 for a short period while the laser beam is scanning across each pixel 18. For the short period while the laser beam is off no colorant 12 is transferred from the donor and deposited on the substrate 14. The result is that each pixel 18 in regions 16 is partly covered by a layer of colorant 12 having the second optical density and is partly bare. The bare portions of pixels 18 constitute gap areas 20.

The cumulative effect of gap areas 20 is to reduce the apparent optical density of screen dot regions 16 (and any other printed parts of proof 10A) from the optical density D' of the transferred colorant to a lower desired value. The apparent optical density can be reduced by making gap areas 20 larger or introducing more gap areas 20 per unit area. In any event, it will be appreciated that the scale of gap areas 20 is significantly smaller than that of screen dot regions 16 Gap areas should be effectively invisible to the unaided eye in the proof and should be distributed so that they have a reasonably uniform density within any colorant covered region of proof 10A.

Figure 3:
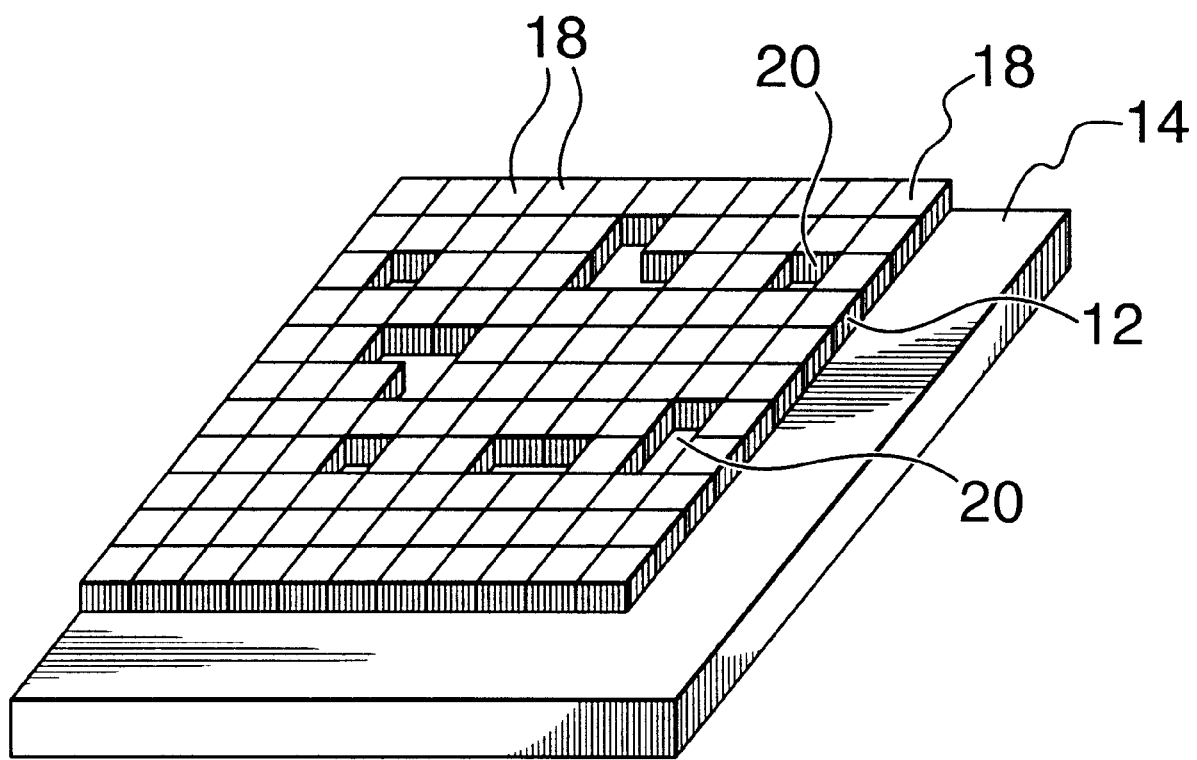

FIG. 3 shows an alternative embodiment of the invention wherein pixels 18 are small relative to screen dots 14 and gap areas 20 are created by leaving some pixels free of transferred colorant (as opposed to leaving a gap area 20 within each pixel 18).

The methods of the invention can also be used to control the apparent optical density of solidly colored areas (as opposed to half tone areas in which an image is made up of a large number of screen dots). A solid area may be treated in the same way that an extremely large screen dot would be treated. The apparent optical density of colorant in the solid area is reduced to a desired value by leaving tiny gap areas which are bare or at least have a significantly reduced optical density within the solid area.

Where a significant solid area is being printed, it is preferable to distribute gap areas 20 randomly or quasi randomly as shown in FIG. 3. If gap areas 20 are arranged in a regular pattern then gap areas 20 may combine with regular features of the image being printed to cause a beat or moire pattern. The use of random screening, also known as stochastic screening or frequency modulated screening is well known in the printing industry as it is used to avoid interference effects between regular features of an image and a screen being used to print the image. It is therefore unnecessary to describe random screening in detail herein.

EXAMPLE

A sheet of APPROVAL™ proofing material manufactured by Kodak (Rochester N.Y.) was used. A laser diode operating at a wavelength of 830 nm was used to transfer colorant from the proofing material to a sheet of paper. The normal operating point for APPROVAL™ proofing material produces an optical density of D=1.5 with a laser energy density of 400 mJ/cm$^2$. This operating point is in the linear portion of the transfer function. Maintaining an optical density of 1.5 requires precise control of laser output power.

The same material was also used in saturation mode. At an energy density of about 700 mJ/cm$^2$ the APPROVAL material produces an optical density of about 2.0. The method of the invention was used to leave small gap areas in the pigment coverage to achieve an apparent optical density of 1.5. Where the substrate is white paper, which has an optical density of nearly zero (i.e has an optical transmission $T_{substrate}$ of approximately 1), the size of the gap areas required can be calculated as set out below. Density D is given by:

$$D = -\log_{10} T \quad (1)$$

where T is transmission. The transmission T of an area having a fraction k covered by colorant having a transmission of $T_1$ (and a corresponding optical density of $D_1$ with $D_1 = -\log_{10} T_1$) and a fraction (1−k) bare of colorant by:

$$T = (1-k)T_{substrate} + k \times T_1 = 1 + k(T_1 - 1) = 10^{-D} \quad (2)$$

The value of k needed to produce an apparent optical density D from a colorant having an optical density $D_1$ is therefore:

$$k = \frac{(10^{-D} - 1)}{(10^{-D_1} - 1)} \quad (3)$$

Where D=1.5 and $D_1$=2.0 then k≈0.978. Thus only approximately 98% of the area of each screen dot region 16 should be covered with colorant 12 having an optical density of 2.0 to produce an apparent optical density of 1.5 for that screen dot region 16. The spot size of the laser or other energy source used to transfer colorant from a donor to the substrate is typically a significant fraction of the area of each pixel 18. Therefore, one cannot simply turn off the laser (or other energy source) for 2% of the time to produce the desired apparent optical density. Instead, one choses a laser duty cycle experimentally to achieve the desired apparent optical density of the deposited colorant. Varying duty cycle of a laser in a laser color proofer in the range of about 50% to about 80% can provide a useful range of apparent optical densities in some cases.

As will be apparent to those skilled in the art in the light of the foregoing disclosure, many alterations and modifications are possible in the practice of this invention without departing from the spirit or scope thereof. For example, while the invention has been described as operating in the saturation region of the transfer function, the invention could be practised in the linear region of the transfer function.

Whereas the invention has been described with respect to the laser transfer of colorant material from a donor sheet to a substrate, the source of energy which causes the transfer is not crucial to the invention. For example, a tiny heating element could be used to generate the energy needed to transfer colorant from the donor to a substrate.

If the gap areas are made very narrow then the gap areas may not be completely empty of colorant but may have some colorant in them. The result is a layer of deposited colorant having a modulated thickness. Such modulation can produce an apparent optical density lower than that of the thicker regions of colorant and comes within the broad scope of the invention.

Accordingly, the scope of the invention is to be construed in accordance with the substance defined by the following claims.

I claim:

1. A method for producing a proof simulating a halftone printed image, the method comprising:

a) providing a halftone image comprising a plurality of screen dots to be printed with an ink of a first optical density;

b) transferring a colorant to a substrate to provide screen dot regions corresponding to the screen dots, the screen dot regions having sizes and shapes substantially the same as the sizes and shapes of the corresponding screen dots, the transferred colorant having a second optical density greater than the first optical density;

c) while transferring the colorant, leaving gap areas within the screen dot regions, the gap areas substantially free of colorant;

wherein the apparent optical density of the screen dot regions is substantially the same as the first optical density.

2. The method of claim 1 wherein transferring the colorant to the substrate comprises irradiating a donor sheet with a laser.

3. The method of claim 2 wherein the laser is operated at a saturation power such that fluctuations in the power output of the laser do not substantially affect the second optical density.

4. The method of claim 1 wherein transferring the colorant comprises transferring colorant into a plurality of pixels which, together, comprise the screen dot region, each of the plurality of pixels comprises an area within which the colorant is deposited and a gap area, transferring the colorant to the substrate comprises irradiating a donor sheet with a laser and, leaving a gap area within each pixel comprises pulsing the laser so that the laser transfers more colorant in some portions of each pixel than in other portions of each pixel.

5. The method of claim 4 wherein the laser is operated at a power output in a saturation portion of a transfer function of the donor sheet such that fluctuations in the power output of the laser do not substantially affect the second optical density.

6. The method of claim 4 wherein the laser is scanned across the substrate in a scan direction and the gap areas have a dimension smaller than 0.2 mm in the scan direction.

7. The method of claim 6 wherein the gap areas comprise narrow stripes extending generally transverse to the scan direction.

8. The method of claim 1 wherein transferring the colorant comprises transferring colorant into a plurality of pixels which, together, comprise the screen dot region and the gap areas comprise pixels within the screen dot region wherein a substantially reduced amount of colorant is transferred to the substrate.

9. The method of claim 8 wherein the gap areas are distributed in a random-like pattern within the screen dot region.

10. The method of claim 1 wherein the halftone image comprises at least one solid region, the method comprising:

a) depositing a colorant on a region of a substrate corresponding to the solid region to yield a layer of deposited colorant, the deposited colorant having an optical density greater than the first optical density;

b) leaving gap areas in the layer of deposited colorant, the gap areas containing substantially no colorant, each gap area having a dimension less than 0.03 mm;

wherein an overall apparent optical density of the region of the substrate is substantially equal to the first optical density.

11. A method for producing a proof simulating a halftone printed image, the method comprising:

a) providing a halftone image comprising a plurality of screen dots to be printed with an ink of a first optical density;

b) transferring a colorant to a substrate within screen dot regions corresponding to the screen dots, the transferred colorant having a second optical density greater than the first optical density;

c) while transferring the colorant, leaving gap areas within the screen dot regions, the gap areas substantially free of colorant;

wherein transferring the colorant comprises irradiating a donor sheet with a laser and thereby transferring colorant into a plurality of pixels which, together, comprise the screen dot region; each pixel comprises an area within which the colorant is deposited and a gap area; leaving a gap area within each pixel comprises pulsing the laser so that the laser transfers more colorant in some portions of each pixel than in other portions of each pixel; and an apparent optical density of the screen dot regions is substantially the same as the first optical density.

* * * * *